US010833501B2

(12) United States Patent
Vogt et al.

(10) Patent No.: US 10,833,501 B2
(45) Date of Patent: Nov. 10, 2020

(54) REVERSE VOLTAGE RECOVERY CIRCUIT

(71) Applicant: TEXAS INSTRUMENTS INCORPORATED, Dallas, TX (US)

(72) Inventors: Justin Patrick Vogt, Plano, TX (US); Michael James Mills, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 335 days.

(21) Appl. No.: 15/801,925

(22) Filed: Nov. 2, 2017

(65) Prior Publication Data
US 2019/0131785 A1  May 2, 2019

(51) Int. Cl.
*H02H 3/00* (2006.01)
*H02H 7/12* (2006.01)
*H03K 5/24* (2006.01)
*H02H 1/00* (2006.01)
*H02M 3/07* (2006.01)

(52) U.S. Cl.
CPC ........ *H02H 7/1213* (2013.01); *H02H 1/0007* (2013.01); *H03K 5/24* (2013.01); *H02M 3/07* (2013.01)

(58) Field of Classification Search
CPC ...... H02H 7/1213; H02H 1/0007; H03K 5/24; H02M 3/07
USPC .......................................................... 361/84
See application file for complete search history.

(56) References Cited

U.S. PATENT DOCUMENTS

| | | | | |
|---|---|---|---|---|
| 6,014,030 A | * | 1/2000 | Smith | G01R 19/16542 320/128 |
| 2015/0092307 A1 | * | 4/2015 | Petruzzi | H02H 9/043 361/56 |

* cited by examiner

*Primary Examiner* — Jared Fureman
*Assistant Examiner* — Lucy M Thomas
(74) *Attorney, Agent, or Firm* — Michael A. Davis, Jr.; Charles A. Brill; Frank D. Cimino

(57) ABSTRACT

A power circuit having a reverse voltage recovery boost circuit that speeds up a recovery time of the power circuit after a reverse voltage condition has cleared is provided. The power circuit includes a reverse voltage detector that detects the reverse voltage condition. After the reverse voltage condition clears, the reverse voltage recovery boost circuit transfers a portion of power to one transistor that is stored in another transistor thereby transitioning the one transistor from a non-conductive state to a conductive state, which allows a transfer of power from the input voltage to the output voltage.

20 Claims, 4 Drawing Sheets

REVERSE VOLTAGE RECOVERY CIRCUIT

TECHNICAL FIELD

This relates generally to an electrical circuit, and more particularly to a reverse voltage recovery circuit.

BACKGROUND

Reverse voltage in an electrical circuit can occur when an output voltage ($V_{OUT}$) exceeds an input voltage ($V_{IN}$), that is $V_{OUT}>V_{IN}$ or when the polarity of the power source is reversed. This condition results in current flowing from the output of the circuit back to the input, which can cause damage to the circuit's components, the input power source, or another electronic components connected to the input. A reverse voltage protection circuit can be implemented at the input or output of the circuit to prevent damage to the components and power supply. A diode, which allows current flow in one direction and prevents current flow in an opposite direction, is typically used in the reverse voltage protection circuit. Diodes, however, have a high power loss at high current loads and are thus, an inefficient means to protect the electronic components.

SUMMARY

In described examples, a power circuit includes a circuit path that has an input that allows an input voltage to supply an output voltage to an output. The circuit path includes a first conductive energy storage device and a second conductive energy storage device in series with the first conductive energy storage device. A reverse voltage detector is provided that has one input connected to the input voltage and another input connected to the output voltage, the reverse voltage detector detecting if the circuit output voltage exceeds the circuit input voltage. A reverse voltage recovery boost circuit is connected to an output of the reverse voltage detector and provides a connection between the first transistor and the second transistor. After a fault detected by the reverse voltage detector clears, the reverse voltage recovery boost circuit transfers a portion of power stored in the second transistor to the first transistor thereby transitioning the first transistor from a non-conductive state to a conductive state thereby allowing the input voltage supply power to the output voltage.

In another example, a system includes an electronic device that includes a power circuit having an input voltage and an output voltage and an external electronic device connected to the output voltage of the power circuit to receive power from the power circuit of the electronic device. The power circuit includes a first conductive energy storage device and a second conductive energy storage device in series with the first conductive energy storage device. A reverse voltage detector is provided and has one input connected to the input voltage and another input connected to the output voltage, the reverse voltage detector detecting if the circuit output voltage exceeds the circuit input voltage. A reverse voltage recovery boost circuit is connected to an output of the reverse voltage detector and provides a connection between the first conductive energy storage device and the second conductive energy storage device. After a fault detected by the reverse voltage detector clears, the reverse voltage recovery boost circuit transfers a portion of power stored in the second conductive energy storage device to the first conductive energy storage device thereby transitioning the first conductive energy storage device from a non-conductive state to a conductive state thereby allowing the input voltage supply power to the output voltage.

In yet another example, a method of receiving an input and providing an output includes supplying an output voltage to an output from an input voltage from an input and detecting if the output voltage is greater than the input voltage. The method further includes disconnecting a circuit path between the input voltage and the output voltage if the output voltage is greater than the input voltage providing a connection between a first energy storage device and a second energy storage device in the circuit path when the output voltage is no longer greater than the input voltage. The method still further includes transferring a portion of power from the second energy storage device to the first energy storage device and reconnecting the circuit path to allow power transfer from the input voltage to the output voltage.

DETAILED DESCRIPTION

Disclosed herein is a reverse voltage recovery boost circuit that speeds up (e.g., from milliseconds to microseconds) a reverse voltage recovery time of a circuit that supplies power. Reverse voltage conditions occur when an output voltage ($V_{OUT}$) exceeds an input voltage ($V_{IN}$) in an electronic device that supplies power (e.g., power supply, power converter, power regulator, etc.). Reverse voltage conditions can be detrimental to circuit components in the electronic device. Reverse voltage recovery circuits are provided in power supply circuits and recover the normal operation ($V_{IN}>V_{OUT}$) of the power supply circuit after the reverse voltage condition has cleared. The time to recover the normal operation of the power circuit after the reverse voltage condition has cleared is a reverse voltage recovery time. If the reverse voltage recovery time is to slow (e.g., milliseconds), the slow recovery time can lead to a voltage dip in the power output, greater power dissipation by the circuit, and false tripping of other protection features in the circuit (short detection, overcurrent, etc.). As mentioned above, the reverse voltage recovery boost circuit speeds up the reverse voltage recovery time, which as will be explained in detail further below, reduces the power circuit voltage dip, which reduces the likelihood of false tripping, and avoids interference with other circuit protection devices.

Figure 1:
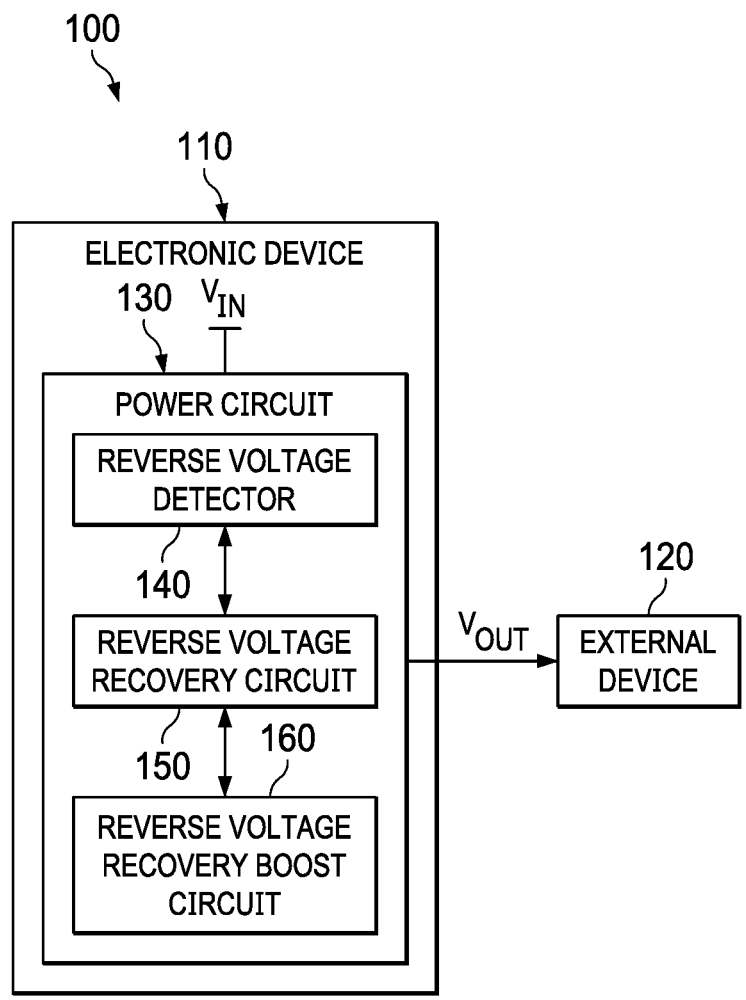
FIG. 1 is a schematic block diagram of an example system to reduce a reverse voltage recovery time.

FIG. 1 illustrates an example system 100 of an electronic device 110 providing power to an external electronic device 120 via a power circuit 130. In one example, the electronic device 110 can be comprised of a power supply, power converter, power regulator, etc. that supplies power via the power circuit 130 to the external electronic device 120 such as a computer, a tablet, a mobile phone, etc. In another example, the electronic device 110 can be a computer, a tablet, a mobile phone, etc. that can supply power via the power circuit 130 to another computer, tablet, mobile phone etc.

The power circuit 130 includes a voltage input that receives an input voltage $V_{IN}$ from the electronic device 120 and a voltage output that supplies an output voltage $V_{OUT}$ to the external electronic device 120. The power circuit includes a reverse voltage detector 140 that detects a reverse voltage condition ($V_{OUT} > V_{IN}$). Specifically, the reverse voltage detector 140 compares the input voltage $V_{IN}$ to the output voltage $V_{OUT}$ and in the event that the output voltage $V_{OUT}$ exceeds the input voltage $V_{IN}$, the reverse voltage detector 140 triggers a device that short circuits the power circuit 130 from the voltage input to the voltage output. Thus, the higher output voltage $V_{OUT}$ is not transferred back through the input voltage $V_{IN}$, which prevents overvoltage conditions from occurring in the electronic device 110 through the input voltage $V_{IN}$.

The power circuit further includes a reverse voltage recovery circuit 150 that, as mentioned above, recovers the normal operation ($V_{IN} > V_{OUT}$) of the power supply circuit 130 after the reverse voltage condition has cleared. After the reverse voltage condition has cleared (e.g., $V_{IN} > V_{OUT}$), as detected by the reverse voltage detector 140, the short circuit is removed from the power circuit 130, which after a time delay (e.g., milliseconds) allows the power circuit 130 to return to its normal operation and supply power from the input voltage $V_{IN}$ to the output voltage $V_{OUT}$.

The power circuit 130 further includes a reverse voltage recovery boost circuit 160 that speeds up (e.g., milliseconds to microseconds) the reverse voltage recovery time to return the power circuit 130 to it normal operation. As will be explained in more detail below, the reverse voltage recovery boost circuit 160 complements the reverse voltage recovery circuit 150 to speed up the reverse voltage recovery time and drive the power circuit 130 to its normal operation. The faster reverse voltage recovery time after the reverse voltage condition clears facilitates a quick (e.g., microseconds) resetting of the circuit to reduce voltage dip, power dissipation, and the likelihood of other protection features falsely tripping.

Figure 2:
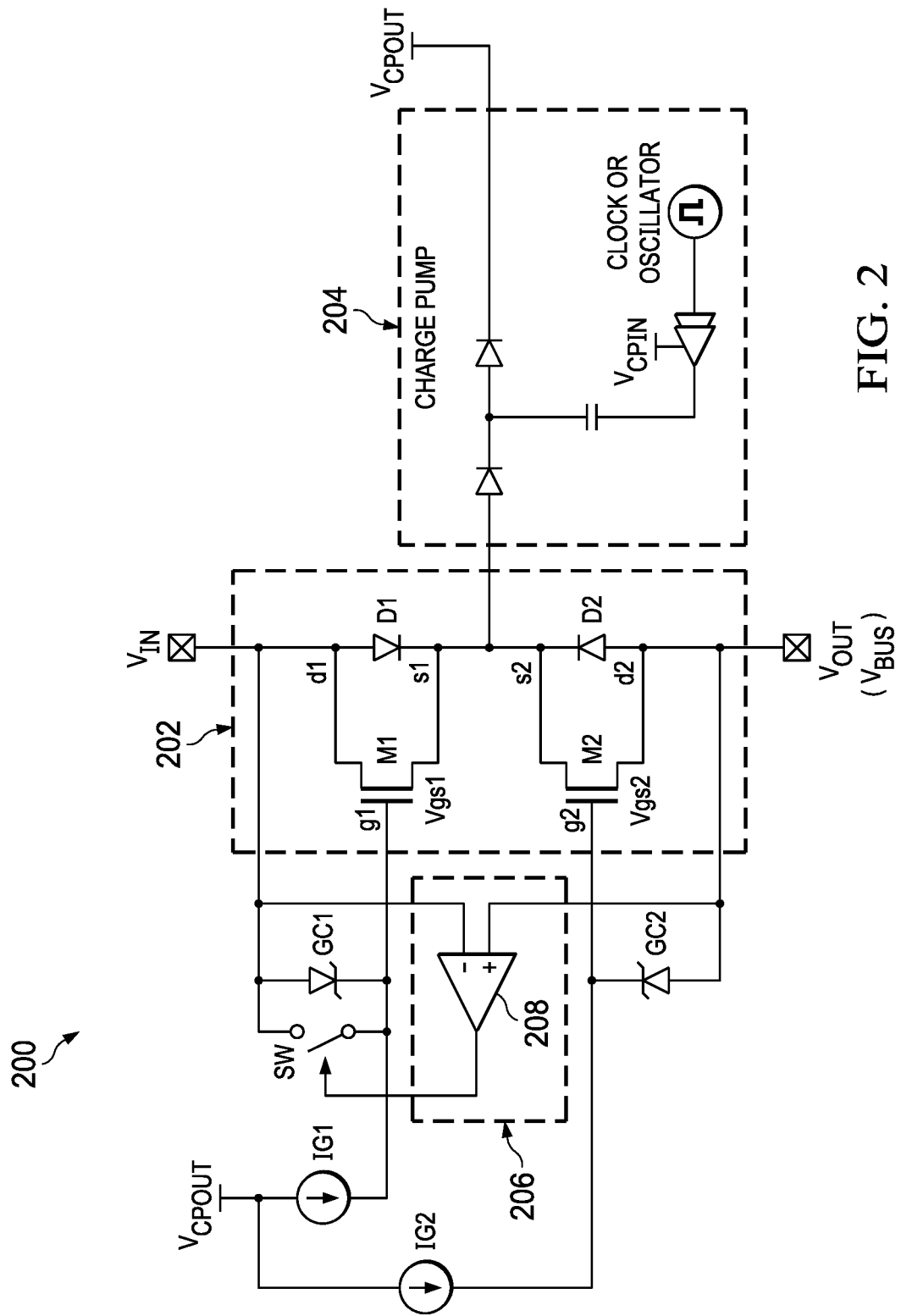
FIG. 2 is an example circuit diagram of a circuit including a reverse voltage recovery circuit.

FIG. 2 is an example power supply circuit 200 having circuitry that serves as a reverse voltage recovery circuit. The power supply circuit 200 includes a circuit path 202 comprised of a first transistor M1 (e.g., MOSFET) and a second transistor M2 (e.g., MOSFET) that are in series with each other. The first transistor M1 includes a first diode D1 disposed between a source s1 and a drain d1 of the first transistor M1. The second transistor M2 includes a second diode D2 disposed between a source s2 and a drain d2 of the second transistor M2. The first M1 and second M2 transistors are powered by a first current source IG1 and a second current source IG2 respectively. During operation of the power supply circuit 200, the first M1 and second M2 transistors provide a current path from the input voltage $V_{IN}$ to the output voltage $V_{OUT}$.

The power supply circuit 200 further includes a charge pump 204 that powers the first IG1 and second IG2 current sources. Specifically, the charge pump 204 increases a pulsed voltage input $V_{CPIN}$ to generate an output voltage $V_{CPOUT}$ that is higher (e.g., at least 12 volts higher) than the circuit input voltage $V_{IN}$. The increased output voltage $V_{CPOUT}$ is delivered to the first IG1 and second IG2 current sources. The increased output voltage $V_{CPOUT}$ ensures that a gate voltage $V_{GS1}$, $V_{GS2}$ exceeds a threshold voltage of each of the first M1 and second M2 transistors to drive both the first M1 and the second M2 transistors into a linear region and into a conductive state from a non-conductive state A first gate clamp structure GC1 (e.g., Zener diode, diode connected (in series) transistors, differential amplifier in conjunction with a resistor divider, etc.) and a second gate clamp structure GC2 (e.g., Zener diode, diode connected (in series) transistor, differential amplifier in conjunction with a resistor divider, etc.) are connected to a gate g1 of the first transistor M1 and a gate g2 of the second transistor M2 respectively. The gate clamps GC1, GC2 clamp the gate-source voltage $V_{GS1}$, $V_{GS2}$ respectively during normal operation. Any time, however, the gate source voltage $V_{GS1}$, $V_{GS2}$ exceeds the clamping voltage, which can occur in reverse voltage conditions, transient voltage ringing, etc., the gate clamps GC1, GC2 will protect the transistors M1, M2. Another purpose of the gate clamps GC1, GC2 is that they set an accurate gate-source voltage to maintain a good drain to source resistance ($R_{DS-ON}$) during operation, and to keep sufficient headroom between the gate and the charge pump to keep the pull-up current source in saturation. This helps maintain stability and performance in circuit components (e.g., reverse voltage controller, current limit controller, etc.), and other circuits that rely on the gate of M1 or M2 to be high impedance for small signal analysis.

The power supply circuit 200 further includes a reverse voltage detector 206 that includes a comparator 208. The comparator 208 includes inputs connected to both the input voltage $V_{IN}$ and the output voltage $V_{OUT}$. An output of the comparator 208 is connected to the switch SW, which is an open position when the circuit is operating in a normal mode (i.e., $V_{IN} > V_{OUT}$). The comparator 206 compares the input voltage $V_{IN}$ to the output voltage $V_{OUT}$ and in the event that the output voltage $V_{OUT}$ exceeds the input voltage $V_{IN}$, the comparator 206 closes the switch SW. When the switch SW is in a closed position, the switch SW essentially short circuits the first transistor M1 from the first current source IG1. Since the first current source IG1 is no longer powering the first transistor M1, the gate voltage $V_{GS1}$ of the first transistor M1 drops below its threshold voltage whereby the first transistor M1 stops conducting thereby stopping the flow of current through the source s1 and the drain d1 and back into the input voltage $V_{IN}$. This condition prevents any overvoltage conditions from occurring in the electronic device through the input voltage $V_{IN}$.

During operation of the power supply circuit 200, the charge pump 202 powers the first IG1 and second IG2 current sources, as described above. The first IG1 and second IG2 current sources start to flow into the gates g1, g2 of the first M1 and second M2 transistors driving them into the linear region where the first M1 and second M2 transistors transition from a non-conductive state to a conductive state. In addition, gate capacitors on both the first M1 and second M2 transistors are charged. When the first M1 and second M2 transistors are in the conductive state, power is provided from the input voltage $V_{IN}$ to the output voltage $V_{OUT}$.

When a reverse voltage condition (fault) occurs, such as when another circuit or component applies a voltage to the output voltage $V_{OUT}$ such that the output voltage $V_{OUT}$ now exceeds the input voltage $V_{IN}$ (reverse voltage condition), current flows from the output voltage $V_{OUT}$ back into the input voltage $V_{IN}$, which as mentioned above creates overvoltage conditions in the power supply circuit 200 and in the electronic device. The comparator 206 of the reverse voltage detector 204, however, detects the reverse voltage condition and closes the switch SW. Closure of the switch SW essentially short circuits the first current source IG1 from the first transistor M1. M1 thus, transitions from the conductive state to the non-conductive state, which terminates current flow from the output voltage $V_{OUT}$ to the input voltage $V_{IN}$. In addition, disconnection of the first current source IG1 from the first transistor M1 causes the gate capacitor on the first transistor M1 to discharge.

After the fault on the output voltage $V_{OUT}$ clears, the comparator 206 detects that the input voltage $V_{IN}$ exceeds the output voltage $V_{OUT}$ and opens the switch SW. The first current source IG1 flows again into the gate g1 of the first transistor M1 driving it back into the linear region, which allows the input voltage $V_{IN}$ to again provide voltage to the output voltage $V_{OUT}$. The reverse voltage recovery time, however, for the first current source IG1 to drive the first transistor M1 back into the linear region is slow (e.g., several milliseconds) as compared to circuit speeds in the electronic device. As mentioned above, the slow recovery time can lead to a voltage dip in the power circuit 200, which can lead to voltage droop, higher power dissipation, and false tripping of other protection circuits.

Figure 3:
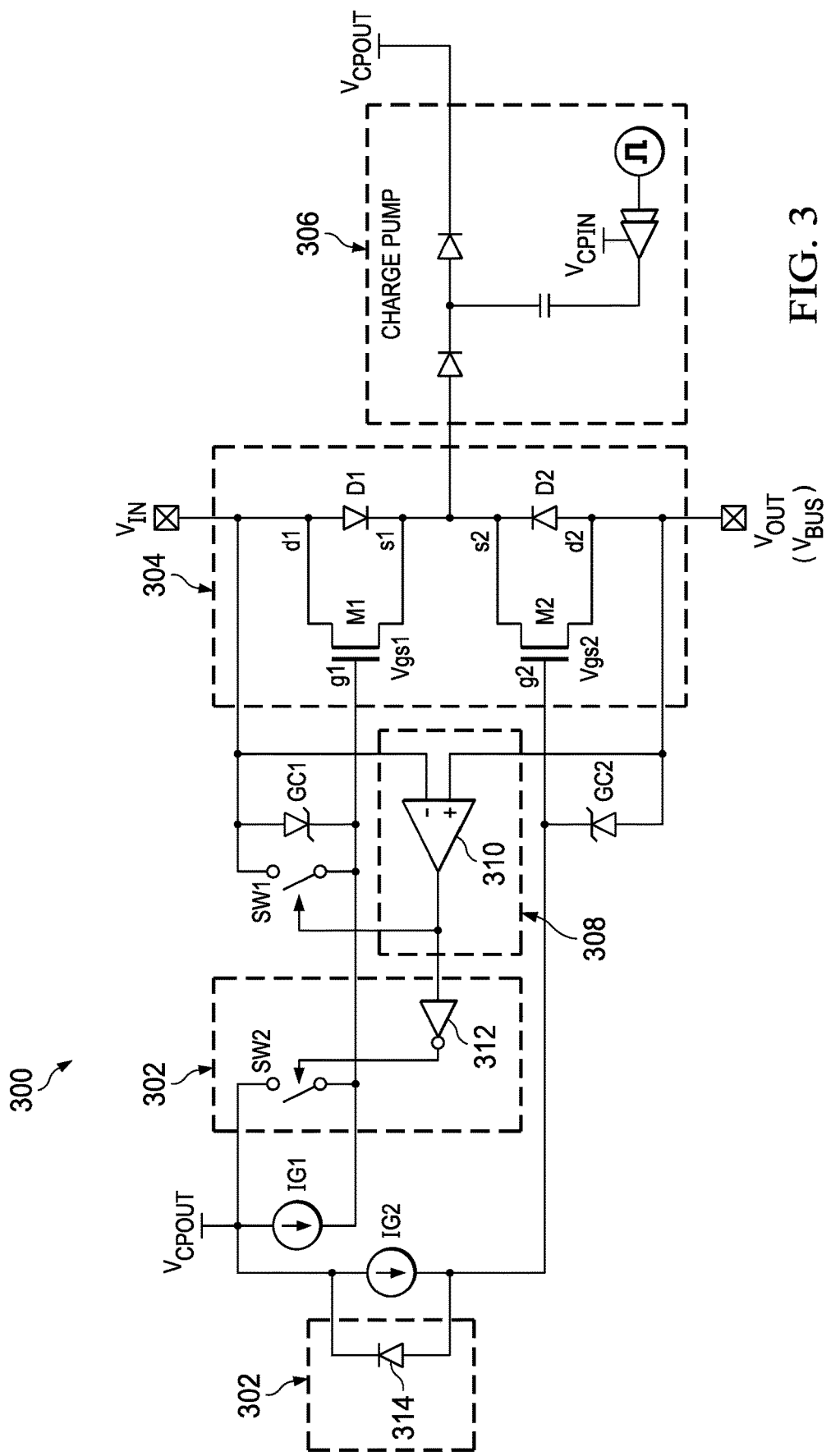
FIG. 3 is an example circuit diagram of a circuit including a reverse voltage recovery circuit.

FIG. 3 illustrates an example power supply circuit 300 that includes a reverse voltage recovery boost circuit 302 comprised of an inverter, a switch, and a diode explained further below. The reverse voltage recovery boost circuit 302 speeds up (e.g., from milliseconds to microseconds) the reverse voltage recovery time. The power supply circuit 300 can correspond to the power circuit 130 in the example of FIG. 1. Therefore, reference can be made to the example of FIG. 1 in the following description of FIG. 3.

The power supply circuit 300 includes a circuit path 304 comprised of a first conductive energy storage (transistor) device (e.g., MOSFET) M1 and a second conductive energy storage device (transistor) M2 (e.g., MOSFET) that are in series with each other. The first transistor M1 includes a first diode D1 disposed between a source s1 and a drain d1 of the first transistor M1. The second transistor M2 includes a second diode D2 disposed between a source s2 and a drain d2 of the second transistor M2. The first M1 and second M2 transistors are powered by a first current source IG1 and a second current source IG2 respectively. During operation of the power supply circuit 300, the first M1 and second M2 transistors provide the current path from a circuit input (e.g., the input voltage $V_{IN}$) to a circuit output (e.g., output voltage $V_{OUT}$).

The power supply circuit 300 further includes a charge pump 306 that powers the first IG1 and second IG2 current sources. Specifically, the charge pump 306 increases a pulsed voltage input $V_{CPIN}$ to generate a charge pump output voltage $V_{CPOUT}$ that is higher than the circuit input voltage $V_{IN}$. The increased output voltage $V_{CPOUT}$ is delivered to the first IG1 and second IG2 current sources. The increased output voltage $V_{CPOUT}$ ensures that a gate voltage $V_{GS1}$, $V_{GS2}$ exceeds a threshold voltage of each of the first M1 and second M2 transistors to drive both the first M1 and the second M2 transistors into a linear region and hence into a conducting state.

A first gate clamp GC1 (e.g., Zener diode, diode connected (in series) transistor, differential amplifier in conjunction with a resistor divider, etc.) and a second gate clamp GC2 (e.g., Zener diode, diode connected (in series) transistor, differential amplifier in conjunction with a resistor divider, etc.) are connected to a gate g1 of the first transistor M1 and a gate g2 of the second transistor M2 respectively. The gate clamps GC1, GC2 clamp the gate-source voltage $V_{GS1}$, $V_{GS2}$ respectively during normal operation. Any time, however, the gate source voltage $V_{GS1}$, $V_{GS2}$ exceeds the clamping voltage, which can occur in reverse voltage conditions, transient voltage ringing, etc., the gate clamps GC1, GC2 will protect the transistors M1, M2. Another purpose of the gate clamps GC1, GC2 is that they set an accurate gate-source voltage to maintain a good drain to source resistance ($R_{DS-ON}$) during operation, and to keep sufficient headroom between the gate and the charge pump to keep the pull-up current source in saturation. This helps maintain stability and performance in circuit components (e.g., reverse voltage controller, current limit controller, etc.), and other circuits that rely on the gate of M1 or M2 to be high impedance for small signal analysis.

The power supply circuit 300 further includes a reverse voltage detector 308 that includes a comparator 310. An inverter 312, which is part of the reverse voltage recovery boost circuit 302, is connected to an output of the comparator 310. The comparator 310 includes inputs connected to both the input voltage $V_{IN}$ and the output voltage $V_{OUT}$. The output of the comparator 310 is also connected to a first switch (first switching device) SW1 and an output of the inverter 312 is connected to a second switch (second switching device) SW2, which is part of the reverse voltage recovery boost circuit 302. Both the first SW1 and the second SW2 switch are in an open position when the circuit is operating in a normal mode (i.e., $V_{IN}$>$V_{OUT}$). The comparator 310 compares the input voltage $V_{IN}$ to the output voltage $V_{OUT}$ and in the event that the output voltage $V_{OUT}$ exceeds the input voltage $V_{IN}$, the comparator 310 closes the first switch SW1. Since the second switch SW2 is connected to the output of the inverter 312, the second switch SW2 remains in the open position. When the first switch SW1 is in a closed position, the first switch SW1 essentially short circuits the first transistor M1 from the first current source IG1. Since the first current source IG1 is no longer powering the first transistor M1, the gate voltage $V_{GS1}$ of the first transistor M1 drops below its threshold voltage whereby the first transistor M1 stops conducting thereby stopping the flow of current through the source s1 and the drain d1 and back into the input voltage $V_{IN}$. This condition prevents any overvoltage conditions from occurring in the electronic device through the input voltage $V_{IN}$.

During operation of the power supply circuit 300, the charge pump 306 powers the first IG1 and second IG2 current sources, as described above. The first IG1 and second IG2 current sources start to flow into the gates g1, g2 of the first M1 and second M2 transistors respectively driving them into the linear region where the first M1 and second M2 transistors transition from a non-conductive state to a conductive state. In addition, gate capacitors on both the first M1 and second M2 transistors are charged. When the first M1 and second M2 transistors are in the conductive state, power is provided from the input voltage $V_{IN}$ to the output voltage $V_{OUT}$.

When a reverse voltage condition (fault) occurs, such as when another circuit or component applies a voltage to the output voltage $V_{OUT}$ such that the output voltage $V_{OUT}$ now exceeds the input voltage $V_{IN}$ (reverse voltage condition), current flows from the output voltage $V_{OUT}$ back into the input voltage $V_{IN}$, which as mentioned above creates overvoltage conditions in the power supply circuit 300 and in the electronic device. The comparator 310 of the reverse voltage detector 308, however, detects the reverse voltage condition and closes the first switch SW1. Closure of the first switch SW1 essentially short circuits the first current source IG1 from the first transistor M1. M1 thus, transitions from the conductive state to the non-conductive state, which terminates current flow from the output voltage $V_{OUT}$ to the input voltage $V_{IN}$. In addition, disconnection of the first current source IG1 from the first transistor M1 causes the gate capacitor on the first transistor M1 to discharge.

After the reverse voltage condition clears, the comparator 310 detects that the input voltage $V_{IN}$ once again exceeds the output voltage $V_{OUT}$ and opens the first switch SW1 thereby reconnecting the first current source IG1 to the first transistor M1. Simultaneously, since the second switch is connected to the inverter 312, which is an inverted output of the comparator 310, the second switch SW2 closes. Since the gate capacitor of the second transistor M2 is fully charged and the gate capacitor of the first transistor M1 is discharged, when the second switch SW2 closes, current flows from the second transistor M2 back through a diode 314, which is part of the reverse voltage recovery boost circuit 302, in parallel with the second current source IG2 and through the second switch SW2 to the first transistor M1. As a result, a portion of the charge on the gate capacitor of the second transistor M2 is rapidly (e.g., microseconds) transferred to the gate capacitor of the first transistor M1. For example, if the gate capacitor of the second transistor M2 is fully charged such that the gate-to-source voltage $V_{gs2}$ of the second transistor M2 is 10V and the gate capacitor of the first transistor M1 is discharged such that the gate-to-source voltage $V_{gs1}$ of the first transistor M1 is 0V, after the second switch SW2 closes, a portion of the gate-to-source voltage $V_{gs2}$ of the second transistor M2 is transferred to M1 such that the gate-to-source voltage $V_{gs1}$, $V_{gs2}$ of the first M1 and second M2 transistors respectively is $5V_{IN}$. The charge transfer allows the first transistor M1 to transition from the non-conductive state to the conductive state, thereby allowing the input voltage $V_{IN}$ to supply power to the output voltage $V_{OUT}$.

The fast transfer of power reduces voltage dip in the power circuit, reduces power dissipation, and reduces the likelihood of other protection features falsely tripping. Specifically, without the reverse voltage recovery boost circuit 302, the first transistor M1 will be in a relatively high impedance state. If a load current on the output voltage $V_{OUT}$ suddenly increases and removes the reverse voltage condition, current will be forced to flow through the first diode D1 instead of the first transistor M1. This in turn will cause $V_{OUT}$ to dip to below $V_{IN}$ (e.g., approximately 700 mV below). With the inclusion of the reverse voltage recovery boost circuit 302, the gate charge on the first transistor M1 will be replenished quickly, (e.g., microseconds) after the reverse voltage condition is removed. Thus, the only voltage dip will be seen at the IR drop of the first M1 and second M2 transistors, which is slightly higher than in steady state, but far away from the dip that $V_{OUT}$ experiences with respect to $V_{IN}$ without the reverse voltage recovery boost circuit.

Another advantage of the reverse voltage recovery boost circuit 302 is that during the recovery time, the boost circuit avoids interference with other protection devices in the power circuit or nearby circuits. Specifically, during operation of the power circuit 300, in order to protect against high current events, the first transistor M1 is used in conjunction with another device (e.g., a sense FET (not shown)) to measure the current flow through the first M1 and second M2 transistors. This protection requires that first transistor M1 be strongly in the linear region of operation to be accurate. When the charge on the gate capacitor of the first transistor M1 is depleted during the reverse voltage condition, the first transistor M1 is no longer in the linear region and thus, there is no current sensing (no current, however, is required during the reverse voltage condition). Without the reverse voltage recovery boost circuit 302, as described above, it takes milliseconds to recover the operation of the power circuit and to also restore the accuracy of the current limit circuit (i.e., the first transistor M1 and the FET), which would lead to false tripping of the protection mechanism leading to a disruption of the power circuit. With the inclusion of the reverse voltage recovery boost circuit 302, the operation of the power circuit 302 and the current limit circuit are restored in microseconds thereby decreasing the vulnerability of the power circuit to overcurrent or shorts to ground during the recovery time.

Figure 4:
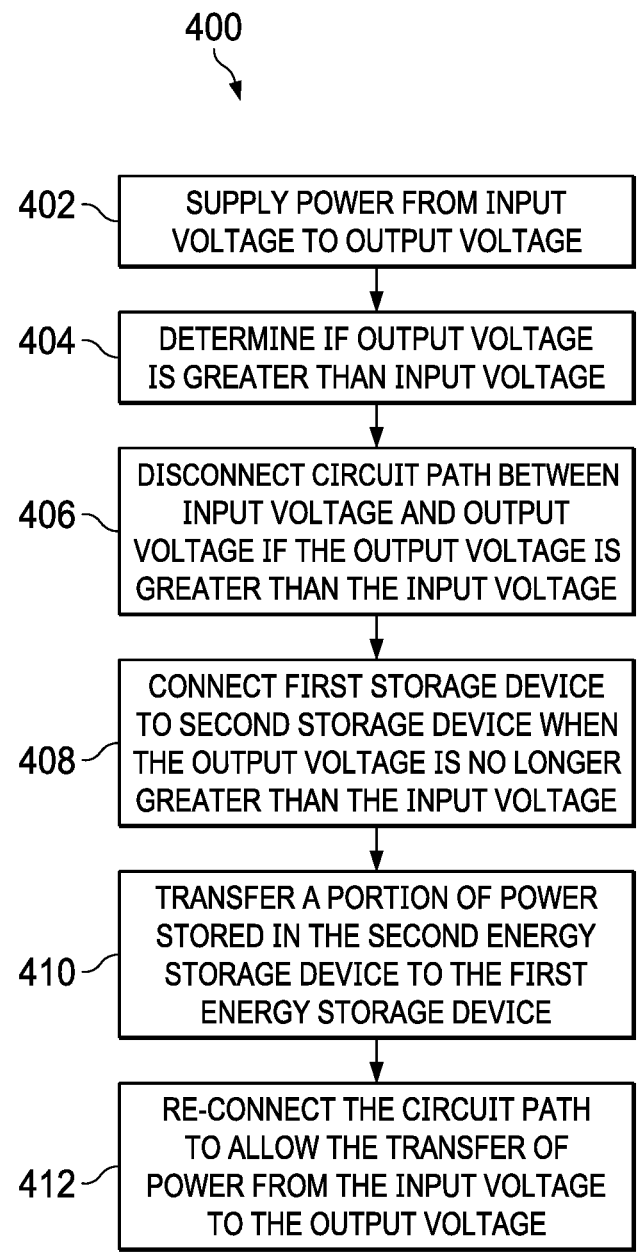
FIG. 4 is a flow diagram of an example method to reduce a reverse voltage recovery time.

FIG. 4 represents an example method 400 of detecting a reverse voltage condition in a circuit and reducing a reverse voltage fault recovery time to reduce the likelihood of component false tripping. At 402, as described herein, an input voltage supplies power to an output voltage. At 404, the input voltage and the output voltage are monitored to determine is the output voltage is greater than the input voltage, thereby indicting a reverse voltage condition. At 406, if the output voltage is greater than the input voltage, a circuit path between the input voltage and the output voltage is disconnected. At 408, when the output voltage is no longer greater than the input voltage, that is, the reverse voltage condition has cleared, a reverse voltage recovery boost circuit provides a connection between a first energy storage device and a second energy storage device in the circuit path. At 410, a portion of stored power in the second energy storage device is transferred to the first energy storage device. At 412, the circuit path is re-connected to thereby allow the transfer of power from the input voltage to the output voltage.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A power circuit, comprising:
    a voltage input;
    a voltage output;
    a first conductive energy storage device and a second conductive energy storage device coupled in series between the voltage input and the voltage output;
    a reverse voltage detector having a detector output and first and second inputs, the first input coupled to the voltage input, the second input coupled to the voltage output, and the reverse voltage detector configured to: provide a fault signal at the detector output responsive to an output voltage at the voltage output exceeding an input voltage at the voltage input; and clear the fault signal at the detector output responsive to the output voltage not exceeding the input voltage; and
    a reverse voltage recovery boost circuit having a circuit input and a switch, the circuit input coupled to the detector output, the switch coupled between the first conductive energy storage device and the second conductive energy storage device, and the reverse voltage recovery boost circuit configured to: responsive to the reverse voltage detector clearing the fault signal, transition the first conductive energy storage device from a non-conductive state to a conductive state by transferring at least a portion of power from the second conductive energy storage device to the first conductive energy storage device, so the voltage input supplies power to the voltage output.

2. The power circuit of claim 1, wherein the first conductive energy storage device is a first transistor, and the second conductive energy storage device is a second transistor.

3. The power circuit of claim 2, wherein
the switch is a first switch;
the power circuit further comprises a second switch coupled to the detector output; and
the second switch is configured to: responsive to the fault signal, close to prevent current flow from the voltage output to the voltage input; and open responsive to the reverse voltage detector clearing the fault signal; and
the reverse voltage recovery boost circuit is configured to close the first switch responsive to the reverse voltage detector clearing the fault signal.

4. The power circuit of claim 3, further comprising:
a first current source coupled to the first transistor, the first current source configured to provide power to the first transistor; and
a second current source coupled to the second transistor, the second current source configured to provide power to the second transistor.

5. The power circuit of claim 4, further comprising a diode coupled in parallel with the second current source, the diode configured to transfer at least the portion of power from the second transistor to the first transistor responsive to the reverse voltage recovery boost circuit closing the first switch.

6. The power circuit of claim 4, further comprising a charge pump configured to supply a charge pump output voltage to the first current source and the second current source, in which the charge pump output voltage is higher than the input voltage, a gate-source voltage of the first transistor exceeds a threshold voltage of the first transistor, and a gate-source voltage of the second transistor exceeds a threshold voltage of the second transistor.

7. The power circuit of claim 2, further comprising: a first gate clamp coupled to a gate of the first transistor; and a second gate clamp coupled to a gate of the second transistor.

8. The power circuit of claim 1, wherein the reverse voltage detector is a comparator, and the reverse voltage recovery boost circuit includes an inverter coupled between the circuit input and the switch.

9. The power circuit of claim 8, wherein the switch is a first switch having an input coupled to an output of the inverter, and the power circuit further comprises a second switch having an input coupled to the detector output.

10. A system, comprising:
a first electronic device including a power circuit having a voltage input and a voltage output;
a second electronic device coupled to the voltage output and configured to receive power from the power circuit;
the power circuit including:
a first conductive energy storage device and a second conductive energy storage device coupled in series between the voltage input and the voltage output;
a reverse voltage detector having a detector output and first and second inputs, the first input coupled to the voltage input, the second input coupled to the voltage output, and the reverse voltage detector configured to: provide a fault signal at the detector output responsive to an output voltage at the voltage output exceeding an input voltage at the voltage input; and clear the fault signal at the detector output responsive to the output voltage not exceeding the input voltage; and
a reverse voltage recovery boost circuit having a circuit input and a switch, the circuit input coupled to the detector output, the switch coupled between the first conductive energy storage device and the second conductive energy storage device, and the reverse voltage recovery boost circuit configured to: responsive to the reverse voltage detector clearing the fault signal, transition the first conductive energy storage device from a non-conductive state to a conductive state by transferring at least a portion of power from the second conductive energy storage device to the first conductive energy storage device, so the voltage input supplies power to the voltage output.

11. The power circuit of claim 10, wherein the first conductive energy storage device is a first transistor, and the second conductive energy storage device is a second transistor.

12. The system of claim 11, wherein
the switch is a first switch;
the power circuit further comprises a second switch coupled to the detector output; and
the second switch is configured to: responsive to the fault signal, close to prevent current flow from the voltage output to the voltage input; and open responsive to the reverse voltage detector clearing the fault signal; and
the reverse voltage recovery boost circuit is configured to close the first switch responsive to the reverse voltage detector clearing the fault signal.

13. The system of claim 12, further comprising:
a first current source coupled to the first transistor, the first current source configured to provide power to the first transistor; and
a second current source coupled to the second transistor, the second current source configured to provide power to the second transistor.

14. The system of claim 13, further comprising a diode coupled in parallel with the second current source, the diode configured to transfer at least the portion of power from the second transistor to the first transistor responsive to the reverse voltage recovery boost circuit closing the first switch.

15. The system of claim 13, further comprising a charge pump configured to supply a charge pump output voltage to the first current source and the second current source, in which the charge pump output voltage is higher than the input voltage, a gate-source voltage of the first transistor exceeds a threshold voltage of the first transistor, and a gate-source voltage of the second transistor exceeds a threshold voltage of the second transistor.

16. The system of claim 11, further comprising: a first gate clamp coupled to a gate of the first transistor; and a second gate clamp coupled to a gate of the second transistor.

17. The system of claim 10, wherein the reverse voltage detector is a comparator, and the reverse voltage recovery boost circuit includes an inverter coupled between the circuit input and the switch.

18. The system of claim 17, wherein the switch is a first switch having an input coupled to an output of the inverter, and the power circuit further comprises a second switch having an input coupled to the detector output.

19. A method of receiving an input and providing an output, the method comprising:

supplying an output voltage to an output from an input voltage at an input;

detecting whether the output voltage is greater than the input voltage;

disconnecting a circuit path between the input voltage and the output voltage responsive to the output voltage being greater than the input voltage;

providing a connection between a first energy storage device and a second energy storage device in the circuit path responsive to the output voltage not being greater than the input voltage;

transferring a portion of power from the second energy storage device to the first energy storage device; and reconnecting the circuit path to allow power transfer from the input voltage to the output voltage.

20. The method of claim 19, wherein the first conductive energy storage device is a first transistor, the second conductive energy storage device is a second transistor, and transferring the portion of power from the second energy storage device to the first energy storage device includes transferring the portion of power to a gate capacitor in the first transistor from a gate capacitor in the second transistor.

\* \* \* \* \*